(12) United States Patent
Fukuoka (10) Patent No.: US 11,404,303 B2
(45) Date of Patent: Aug. 2, 2022

(54) CUTTING APPARATUS FOR CUTTING WORKPIECE WITH CUTTING BLADE

(71) Applicant: DISCO CORPORATION, Tokyo (JP)

(72) Inventor: Takeomi Fukuoka, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 91 days.

(21) Appl. No.: 17/149,155

(22) Filed: Jan. 14, 2021

(65) Prior Publication Data

US 2021/0237299 A1      Aug. 5, 2021

(30) Foreign Application Priority Data

Feb. 4, 2020   (JP) .............................. JP2020-016991

(51) Int. Cl.
| | |
|---|---|
| *H01L 21/683* | (2006.01) |
| *B26D 7/01* | (2006.01) |
| *B26D 7/04* | (2006.01) |
| *B26D 7/02* | (2006.01) |
| *B28D 5/00* | (2006.01) |

(52) U.S. Cl.
CPC .......... *H01L 21/6838* (2013.01); *B26D 7/018* (2013.01); *B26D 7/02* (2013.01); *B26D 7/04* (2013.01); *B28D 5/0094* (2013.01)

(58) Field of Classification Search
CPC . Y10T 83/10; Y10T 83/0304; Y10T 83/0333; B26D 7/04; B26D 7/018; B26D 7/02; B28D 5/0094; B28D 5/00; B28D 5/0005; B28D 5/0017; B28D 5/0023; B28D 5/0029; B28D 5/0052; B28D 5/0058; B28D 5/0076; B28D 5/0082; H01L 21/6638; H01L 21/304; H01L 21/3043; H01L 21/50; H01L 21/67; H01L 21/673; H01L 21/677; H01L 21/67703; H01L 21/67712; H01L 21/67724; H01L 21/67733; H01L 21/67739; H01L 21/67742; H01L 21/683; H01L 21/68778
See application file for complete search history.

(56) References Cited

U.S. PATENT DOCUMENTS

| | | | |
|---|---|---|---|
| 10,297,488 B2 * | 5/2019 | Fukuoka | B28D 5/0094 |
| 2019/0198379 A1 * | 6/2019 | Sekiya | H01L 21/68728 |
| 2019/0295850 A1 * | 9/2019 | Arakida | H01L 21/67051 |
| 2019/0326136 A1 * | 10/2019 | Ueyama | H01L 21/68 |

FOREIGN PATENT DOCUMENTS

JP       2019111628 A     7/2019

\* cited by examiner

*Primary Examiner* — Phong H Nguyen
(74) *Attorney, Agent, or Firm* — Greer Burns & Crain Ltd.

(57) ABSTRACT

A cutting apparatus for cutting a workpiece includes a cutting unit for cutting the workpiece with a cutting blade, a moving unit for moving the cutting unit, a delivery pad for delivering the workpiece, and a counterbalance assembly connected to the delivery pad, for applying a pull-up force to the delivery pad. The delivery pad holds the workpiece under suction while being mounted on the moving unit and delivers the workpiece by being moved by the moving unit while holding the workpiece under suction.

4 Claims, 6 Drawing Sheets

CUTTING APPARATUS FOR CUTTING WORKPIECE WITH CUTTING BLADE

BACKGROUND OF THE INVENTION

Field of the Invention

The present invention relates to a cutting apparatus for cutting a workpiece with a cutting blade.

Description of the Related Art

In a manufacturing step of device chips, there is known a cutting apparatus for cutting a substrate such as a semiconductor wafer, a packaged substrate, a ceramic substrate, or a glass substrate with a cutting blade mounted on a spindle. The cutting apparatus includes a cutting unit having the cutting blade and a chuck table for holding the substrate, i.e., a workpiece. The operator of the cutting apparatus loads the workpiece into the cutting apparatus and places the workpiece on a holding surface provided by an upper surface of the chuck table. Then, the operator causes the chuck table to hold the workpiece under suction on the holding surface and bring the cutting blade as it rotates into contact with the workpiece, thereby cutting the workpiece. After the workpiece has been cut, the operator unloads the workpiece from the chuck table. The cutting apparatus in which the operator loads the workpiece onto the chuck table and unloads the workpiece from the chuck table is known as a manual cutting apparatus. There is also known a fully automatic cutting apparatus that automatically loads the workpiece onto the chuck table and unloads the workpiece from the chuck table.

The fully automatic cutting apparatus includes a placing area where a workpiece to be processed is placed, an unloading area where a processed workpiece is placed, and a delivery mechanism for loading and unloading a workpiece. The delivery mechanism loads a workpiece to be processed that is placed in the placing area onto a chuck table and unloads a processed workpiece from the chuck table to the unloading area. The fully automatic cutting apparatus may further include a cleaning unit for cleaning a processed workpiece. The manual cutting apparatus that is free of a delivery mechanism is inexpensive and relatively simple in configuration and requires a small footprint for installation. However, since the operator has to manually load and unload workpieces with predetermined timings before and after they are processed, the manual cutting apparatus needs operating periodically by the operator.

On the other hand, the fully automatic cutting apparatus with the delivery mechanism allows the operator to load and unload workpieces into and from the cutting apparatus anytime regardless of how much progress a cutting process is making. However, since the fully automatic cutting apparatus includes the independent delivery mechanism, the fully automatic cutting apparatus is complex in configuration, highly costly, and requires a relatively large space for installation because of its large size. In view of the above drawbacks, there has been developed a cutting apparatus including a delivery mechanism for delivering workpieces that is relatively simple in configuration and can be added to existing manual cutting apparatus (see JP 2019-111628A).

SUMMARY OF THE INVENTION

The cutting apparatus disclosed in JP 2019-111628A includes a delivery pad that can detachably be mounted on a moving unit for moving a cutting unit. When the delivery pad is mounted on the moving unit and holds a workpiece, and then the moving unit is moved, the workpiece is delivered by the moving unit. However, inasmuch as the moving unit moves, as well as the cutting unit, the delivery pad that includes a holding mechanism for holding the workpiece and that has a non-negligible weight, a higher load than heretofore is imposed on the moving unit. Therefore, the moving unit tends to wear early. The moving unit needs a predetermined performance for moving the cutting unit accurately to process the workpiece highly accurately. When wear on the moving unit has progressed, the moving unit is unable to do the predetermined performance, resulting in a reduction in the accuracy with which the cutting apparatus processes the workpiece.

It is therefore an object of the present invention to provide a cutting apparatus that reduces a load applied to a moving unit used to move a delivery pad and restrains wear on the moving unit.

In accordance with an aspect of the present invention, there is provided a cutting apparatus for cutting a workpiece with a cutting blade, including a chuck table having an upwardly exposed holding surface, for holding the workpiece on the holding surface, a cutting unit for cutting the workpiece held on the holding surface of the chuck table with the cutting blade that is mounted on a spindle, a processing-feed unit for moving the chuck table in a processing-feed direction parallel to the holding surface between a processing area in which the workpiece is cut by the cutting blade and a loading/unloading area in which the workpiece is loaded and unloaded, a moving unit for moving the cutting unit in an indexing-feed direction parallel to the holding surface and perpendicular to the processing-feed direction and a direction perpendicular to the holding surface, a placing area disposed adjacent to the loading/unloading area, for placing the workpiece to be cut therein, an unloading table for supporting the workpiece that has been cut, the unloading table being movable between an area directly above the loading/unloading area and an unloading area disposed adjacent to the loading/unloading area, a delivery pad for delivering the workpiece to be cut that is placed in the placing area onto the chuck table that is positioned in the loading/unloading area and delivering the workpiece that has been cut that is placed on the chuck table to onto the unloading table, and a counterbalance assembly connected to the delivery pad, for applying a pull-up force to the delivery pad. The delivery pad is detachably mounted on the moving unit in a standby area disposed adjacent to the loading/unloading area, holds the workpiece under suction while being mounted on the moving unit, and delivers the workpiece by being moved by the moving unit while holding the workpiece under suction.

Preferably, a magnitude of the pull-up force applied to the delivery pad by the counterbalance assembly is equal to or smaller than a magnitude of a gravitational force imposed on the delivery pad.

Preferably, the counterbalance assembly includes a fluid pressure cylinder having an end fixed to an upper portion of the delivery pad and housing part of a piston rod therein over a variable length, the fluid pressure cylinder being extensible and contractible by varying the variable length over which the part of the piston rod is housed in the fluid pressure cylinder.

In the cutting apparatus according to the aspect of the present invention, the counterbalance assembly is connected to the delivery pad that is used to deliver the workpiece. The counterbalance assembly applies a pull-up force to the delivery pad. Therefore, a load imposed on the moving unit on which the delivery pad is mounted is reduced, restraining wear on the moving unit.

According to the present invention, therefore, there is provided a cutting apparatus in which the load imposed on the moving unit that used to deliver the workpiece is reduced, restraining wear on the moving unit.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
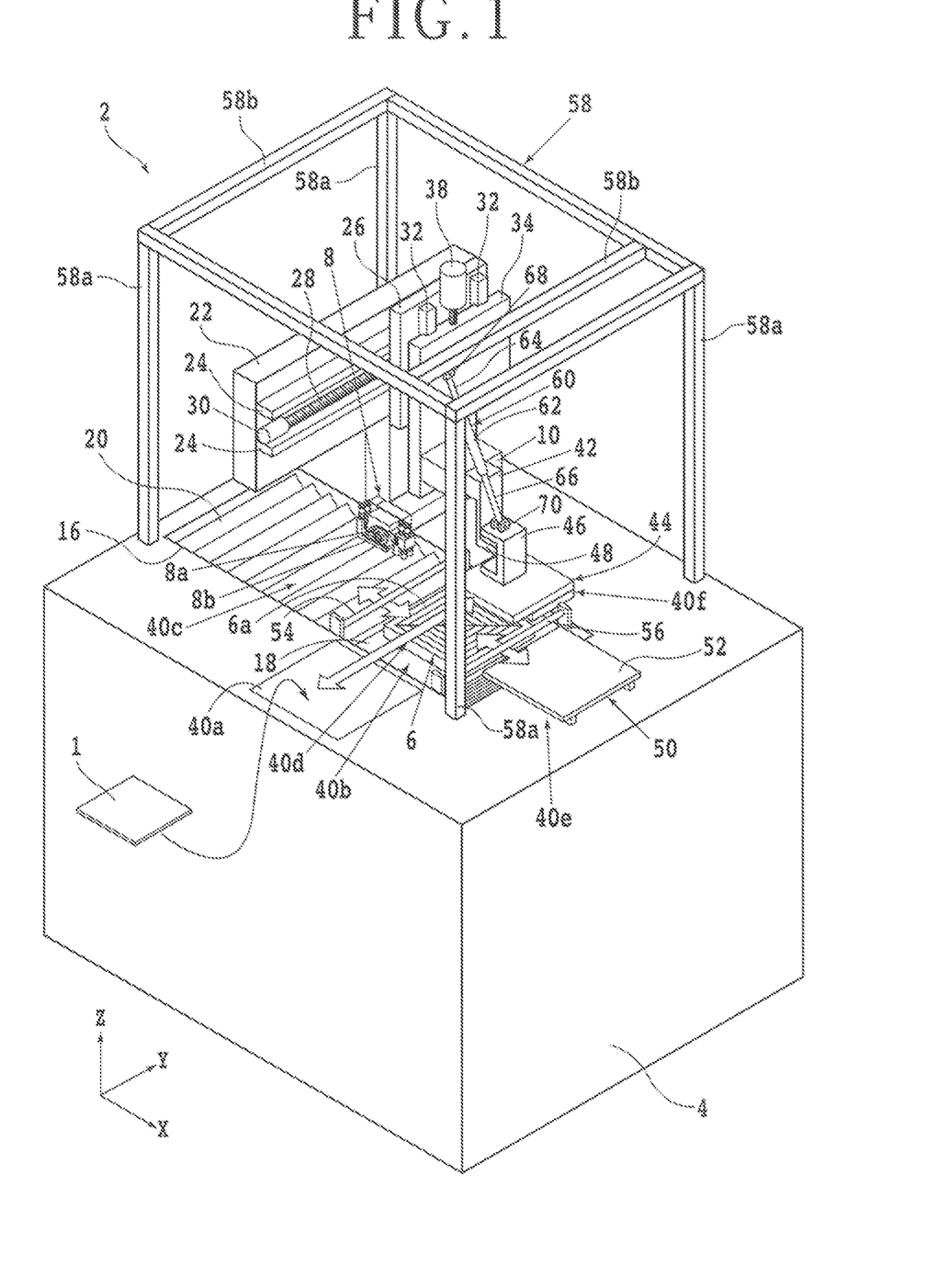
FIG. 1 is a perspective view schematically illustrating a workpiece and a cutting apparatus according to an embodiment of the present invention.

A cutting apparatus according to a preferred embodiment of the present invention will be described below with reference to the accompanying drawings. In the drawings, X-axis, Y-axis, and Z-axis directions that are perpendicular to each other are established with respect to the cutting apparatus, and will be referred to with regard to the orientations of some components of the cutting apparatus. First, a workpiece to be processed, i.e., cut, by the cutting apparatus will be described below with reference to FIG. 1. FIG. 1 illustrates in perspective view the workpiece, denoted by 1, and the cutting apparatus, denoted by 2. The workpiece 1 is in the form of a substrate made of, for example, silicon, silicon carbide (SiC), a material such as another semiconductor material, or a material such as sapphire, glass, quartz, or ceramic. Alternatively, the workpiece 1 is in the form of a packaged substrate in which devices are encapsulated by a resin. The workpiece 1 has a grid of projected dicing lines established on a surface thereof. When the workpiece 1 is cut along the projected dicing lines, the workpiece 1 is divided into device chips. However, the workpiece 1 is not limited to such a substrate, but may be in the form of a substrate free of devices, for example.

The cutting apparatus 2 according to the present embodiment will be described below. The cutting apparatus 2 includes an apparatus base 4 supporting various components thereon, a chuck table 6 disposed on an upper surface of the apparatus base 4, for holding the workpiece 1 under suction thereon, and a cutting unit 8 for cutting the workpiece 1 held on the chuck table 6. The chuck table 6 holds the workpiece 1 under suction thereon, and the cutting unit 8 cuts the workpiece 1 held on the chuck table 6. The cutting apparatus 2 further includes a camera unit 10 disposed in a position adjacent to the cutting unit 8, for capturing an image of the workpiece 1 on the chuck table 6. The image captured by the camera unit 10 will be used in an alignment step for aligning the workpiece 1 and the cutting unit 8 with each other.

The chuck table 6 has a suction channel, not illustrated, defined therein that has an end connected to a suction source and another end connected to a porous member disposed in an upper portion of the chuck table 6. The porous member is exposed upwardly and has an upper surface functioning as a holding surface 6a of the chuck table 6. Stated otherwise, the chuck table 6 has an upwardly exposed holding surface 6a. When the workpiece 1 is placed on the holding surface 6a and the suction source is actuated to apply a negative pressure through the porous member to the workpiece 1, the workpiece 1 is held under suction on the holding surface 6a. The chuck table 6 is rotatable about an axis extending in the Z-axis directions that are perpendicular to the holding surface 6a.

The apparatus base 4 has a rectangular opening 16 defined centrally in an upper surface thereof and having longer sides extending along the X-axis directions and shorter sides extending along the Y-axis directions. The opening 16 houses therein an X-axis movable table 18 and a dust-proof, drip-proof cover 20 having an end attached to the X-axis movable table 18. A processing-feed unit, not illustrated, for moving the X-axis movable table 18 along the X-axis directions that are parallel to the holding surface 6a of the chuck table 6 is disposed in a region below the X-axis movable table 18 and protected by the dust-proof, drip-proof cover 20. The processing-feed unit processing-feeds the chuck table 6 in the X-axis directions when the cutting unit 8 cuts the workpiece 1. In other words, the X-axis directions represent processing-feed directions. The processing-feed unit also moves the chuck table 6 along the processing-feed directions, i.e., the X-axis directions, between a processing area 40c where the cutting unit 8 cuts the workpiece 1 and a loading/unloading area 40b where the workpiece 1 as uncut is loaded onto the chuck table 6 and the workpiece 1 as cut is unloaded from the chuck table 6.

A support structure 22 having a protrusive portion extending over the opening 16 is erected on a rear portion of the upper surface of the apparatus base 4. The support structure 22 has a front surface on which a pair of Y-axis guide rails 24 extending in the Y-axis directions are mounted. A Y-axis movable plate 26 is slidably disposed on the Y-axis guide rails 24 for sliding movement therealong. A nut, not illustrated, is mounted on a reverse or rear surface of the Y-axis movable plate 26 and operatively threaded over a Y-axis ball screw 28 disposed between and extending parallel to the Y-axis guide rails 24. The Y-axis ball screw 28 has an end coupled to a Y-axis stepping motor 30. When the Y-axis stepping motor 30 is energized, it rotates the Y-axis ball screw 28 about its central axis, causing the nut to move the Y-axis movable plate 26 along the Y-axis guide rails 24 in one of the Y-axis directions. The Y-axis guide rails 24, the Y-axis movable plate 26, the Y-axis ball screw 28, and the Y-axis stepping motor 30 jointly function as an indexing-feed unit for indexing-feeding the cutting unit 8 and the camera unit 10 in the Y-axis directions. In other words, the Y-axis directions represent indexing-feed directions.

The Y-axis movable plate 26 has a front surface on which a pair of Z-axis guide rails 32 extending in the Z-axis directions are mounted. A Z-axis movable plate 34 is slidably disposed on the Z-axis guide rails 32 for sliding movement therealong. A nut, not illustrated, is mounted on a reverse or rear surface of the Z-axis movable plate 34 and operatively threaded over a Z-axis ball screw disposed between and extending parallel to the Z-axis guide rails 32. The Z-axis ball screw has an end coupled to a Z-axis stepping motor 38. When the Z-axis stepping motor 38 is energized, it rotates the Z-axis ball screw about its central axis, causing the nut to move the Z-axis movable plate 34 along the Z-axis guide rails 32 in one of the Z-axis directions. The cutting unit 8 and the camera unit 10 are fixedly mounted on a lower portion of a front surface of the Z-axis movable plate 34. The Z-axis guide rails 32, the Z-axis movable plate 34, the Z-axis ball screw, and the Z-axis stepping motor 38 jointly function as a lifting and lowering unit for moving the cutting unit 8 and the camera unit 10 in the Z-axis directions perpendicular to the holding surface 6a of the chuck table 6. The indexing-feed unit and the lifting and lowering unit jointly function as a moving unit for moving the cutting unit 8 and other components.

The cutting unit 8 includes a spindle, not illustrated, extending along the Y-axis directions and an annular cutting blade 8a mounted on a distal end of the spindle. A spindle motor, not illustrated, for rotating the spindle about its central axis parallel to the Y-axis directions is connected to a proximal end of the spindle. When the spindle motor is energized, the spindle is rotated about its central axis, rotating the cutting blade 8a about its central axis.

The cutting blade 8a has a cutting edge on its outer circumferential portion. The cutting edge includes abrasive grains and a bonding material that binds the abrasive grains dispersed therein. When the cutting blade 8a is positioned at a predetermined height while it is in rotation and the X-axis movable table 18 is moved in one of the processing-feed directions, the cutting blade 8a cuts the workpiece 1 on the chuck table 6. Specifically, in the processing area 40c, the cutting unit 8 cuts the workpiece 1 held on the holding surface 6a of the chuck table 6 with the cutting blade 8a. When the cutting blade 8a cuts the workpiece 1, pieces of swarf are produced from the workpiece 1 and scattered around. In addition, heat generated by the cutting process makes the workpiece 1 and the cutting blade 8a higher at temperature. While the cutting blade 8a is cutting the workpiece 1, therefore, a cutting fluid is supplied to the workpiece 1 and the cutting blade 8a to cool them. Specifically, a nozzle 8b is disposed alongside of the cutting blade 8a, and the cutting fluid is supplied from the nozzle 8b to an upper surface of the workpiece 1 and the cutting blade 8a. The cutting fluid supplied from the nozzle 8b may be pure water, for example. The cutting fluid has a function to cool the workpiece 1 and the cutting blade 8a. The pieces of swarf produced from the workpiece 1 in the cutting process are caused by the cutting fluid to flow off the workpiece 1 and are drained.

A placing area 40a where the workpiece 1 to be cut is placed is located in a position adjacent to the loading/unloading area 40b on the upper surface of the apparatus base 4. The operator of the cutting apparatus 2 places the workpiece 1 to be cut onto the placing area 40a with any timing. An unloading unit 50 for unloading the workpiece 1 that has been cut is disposed in another position adjacent to the loading/unloading area 40b on the upper surface of the apparatus base 4. The unloading unit 50 includes an unloading table 52 for placing and supporting the workpiece 1 thereon. The unloading table 52 is movable between an area 40d directly above the loading/unloading area 40b and an unloading area 40e adjacent to the loading/unloading area 40b.

The workpiece 1 that has been cut by the cutting unit 8 in the processing area 40c is moved together with the chuck table 6 to the loading/unloading area 40b from which the workpiece 1 is lifted off the chuck table 6 by a delivery pad 44 to be described later. Thereafter, the unloading table 52 is moved from the unloading area 40e to the area 40d directly above the loading/unloading area 40b, and then the workpiece 1 is lowered onto the unloading table 52. The unloading table 52 is then moved from the area 40d directly above the loading/unloading area 40b to the unloading area 40e. The operator can unload the cut workpiece 1 from the unloading table 52 positioned in the unloading area 40e with any timing.

The cutting apparatus 2 includes a pipe-shaped cleaning nozzle 54 disposed above the path along which the chuck table 6 is movable between the processing area 40c and the loading/unloading area 40b and extending over the opening 16 in the indexing-feed directions, i.e., the Y-axis directions. The cleaning nozzle 54 has a plurality of ejection ports, not illustrated, defined therein that face downwardly. The cleaning nozzle 54 ejects a cleaning fluid downwardly from the ejection ports. When the cleaning nozzle 54 ejects the cleaning fluid while the chuck table 6 is moving from the processing area 40c to the loading/unloading area 40b, the cleaning fluid is applied to the workpiece 1 on the chuck table 6, cleaning the workpiece 1 that has been cut by the cutting unit 8. For a better cleaning effect, the cleaning nozzle 54 may eject the cleaning liquid under high pressure to the workpiece 1. The cleaning nozzle 54 may eject pure water as the cleaning fluid or may eject a mixture of two fluids such as air and a cleaning fluid, for example.

The cutting apparatus 2 further includes a pipe-shaped drying nozzle 56 disposed above the path along which the unloading table 52 is movable between the area 40d directly above the loading/unloading area 40b and the unloading area 40e and extending over the path in the indexing-feed directions, i.e., the Y-axis directions. The drying nozzle 56 has a plurality of ejection ports, not illustrated, defined therein that face downwardly. The drying nozzle 56 ejects a gas such as drying air from the ejection ports. When the drying nozzle 56 ejects the drying fluid while the unloading table 52 is moving from the area 40d directly above the loading/unloading area 40b to the unloading area 40e, the drying fluid is applied to the workpiece 1 on the unloading table 52, drying the workpiece 1.

The cutting apparatus 2 includes the delivery pad 44, referred to above, that delivers the workpiece 1 to be cut from the placing area 40a to the chuck table 6 positioned in the loading/unloading area 40b and that also delivers the workpiece 1 that has been cut from the chuck table 6 to the unloading table 52. The delivery pad 44 is detachably mounted on the moving unit, referred to above, for moving the cutting unit 8 and other components, and is supported and moved by the moving unit. FIGS. 2A through 3B schematically illustrate in side elevation the delivery pad 44 and the Z-axis movable plate 34 included in the moving unit. As illustrated in FIGS. 2A through 3B, an arm 42 extending in the X-axis directions is fixed to a front surface of the Z-axis movable plate 34. The arm 42 includes an engaging portion 48 extending downwardly from a distal end thereof for engaging an engaged portion 46 of the delivery pad 44. The arm 42 has two suction channels, not illustrated, defined therein and having respective ends extending into the engaging portion 48 and respective other ends connected respectively to independent suction sources, not illustrated.

The delivery pad 44 has a suction channel, not illustrated, defined therein that has an end extending downwardly to a lower surface thereof. The delivery pad 44 includes the engaged portion 46, referred to above, as an upper portion thereof, and the suction channel in the delivery pad 44 has another end extending into the engaged portion 46. For mounting the delivery pad 44 on the moving unit, the engaged portion 46 of the delivery pad 44 is brought into contact with the engaging portion 48 of the arm 42, bringing one of the two suction channels in the arm 42 into fluid communication with the suction channel in the delivery pad 44. At this time, the other suction channel in the arm 42 has an end facing the engaged portion 46 of the delivery pad 44, and when a negative pressure is applied through the other suction channel to the engaged portion 46, the delivery pad 44 is attracted under suction and secured to the moving unit. The delivery pad 44 has a lower surface acting as a suction surface for holding the workpiece 1 under suction thereon. The delivery pad 44 can hold the workpiece 1 under suction on the suction surface by applying a negative pressure through the one suction channel in the arm 42 and the suction channel in the delivery pad 44 to the workpiece 1 held in contact with the suction surface.

The arm 42 and the engaged portion 46 are made of a metal material containing aluminum as a main constituent, for example, for weight reduction. However, mutually contacting regions of the engaged portion 46 and the engaging portion 48 may be made of stainless steel, for example, for increased intimate contact therebetween, and their contacting surfaces may be polished. Further, those contacting regions may be surrounded by sealing members such as O-rings for higher hermetic sealability thereof.

As illustrated in FIG. 1, the cutting apparatus 2 also includes, in addition to the placing area 40a and the unloading area 40e adjacent to the loading/unloading area 40b, a table-shaped standby area 40f in another position adjacent to the loading/unloading area 40b. When the delivery pad 44 is not mounted on the Z-axis movable plate 34 included in the moving unit, the delivery pad 44 is placed in the standby area 40f and stored therein. For example, when the workpiece 1 is cut by the cutting unit 8, the delivery pad 44 is placed in the standby area 40f for reducing the load on the moving unit.

Figure 2A:
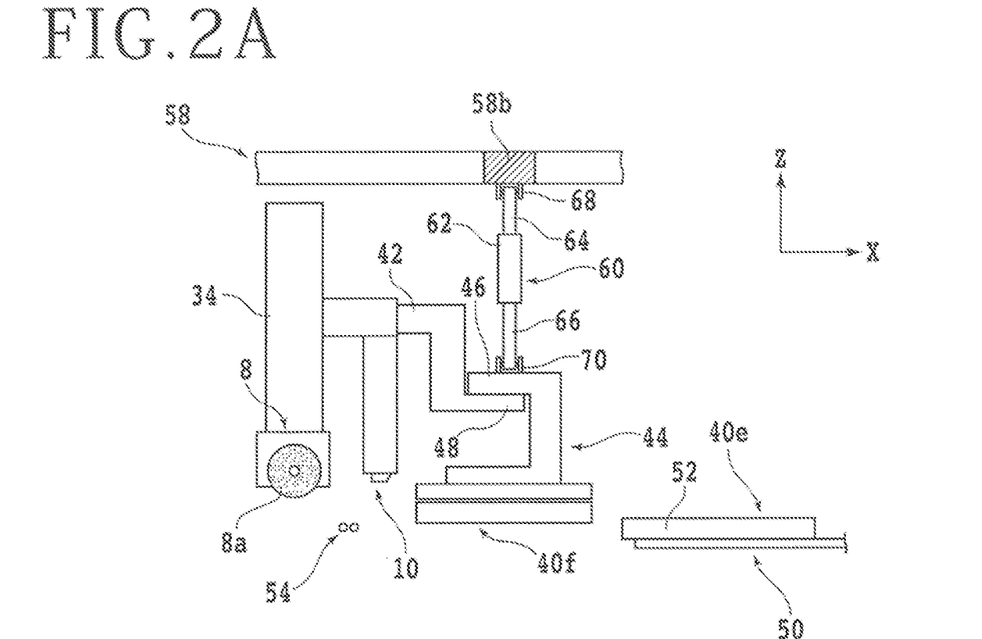
FIG. 2A is a side elevational view schematically illustrating a manner in which a delivery pad is mounted on a moving unit.
Figure 4A:
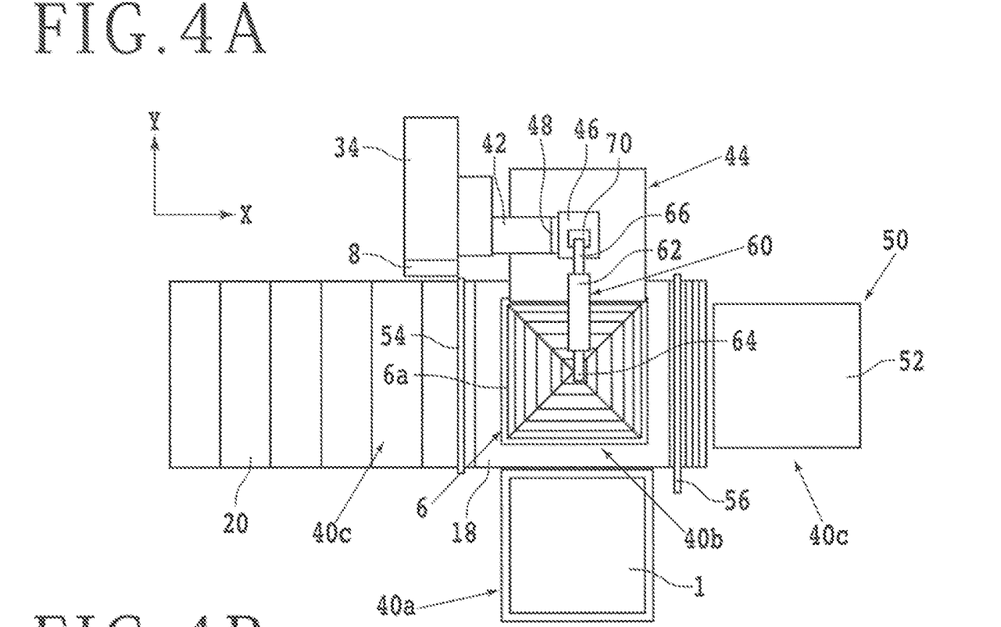
FIG. 4A is a plan view schematically illustrating a manner in which the delivery pad is mounted on the moving unit.

Processes for loading the workpiece 1 into the cutting apparatus 2 and unloading the workpiece 1 from the cutting apparatus 2 and cutting the workpiece 1 will be described below with reference to the drawings. First, as illustrated in FIG. 1, the operator of the cutting apparatus 2 places the workpiece 1 in the placing area 40a. The delivery pad 44 delivers the workpiece 1 from the placing area 40a to the holding surface 6a of the chuck table 6. For delivering the workpiece 1 with the delivery pad 44, the delivery pad 44 is mounted on the Z-axis movable plate 34 of the moving unit. Since the delivery pad 44 has been placed in the standby area 40f prior to being mounted on the Z-axis movable plate 34, the moving unit is actuated to position the engaging portion 48 that extends downwardly from the distal end of the arm 42 directly below the engaged portion 46 of the delivery pad 44. Then, the Z-axis movable plate 34 is moved in one of the Z-axis directions to bring the engaging portion 48 into contact with the engaged portion 46. FIG. 2A schematically illustrates in side elevation a manner in which the delivery pad 44 is mounted on the moving unit, and FIG. 4A schematically illustrates in plan a manner in which the delivery pad 44 is mounted on the moving unit. FIGS. 2A and 4A schematically illustrates a manner in which the engaging portion 48 and the engaged portion 46 are held in contact with each other. When a negative pressure is then applied from the engaging portion 48 to the engaged portion 46, the delivery pad 44 is mounted on the moving unit.

Figure 4B:
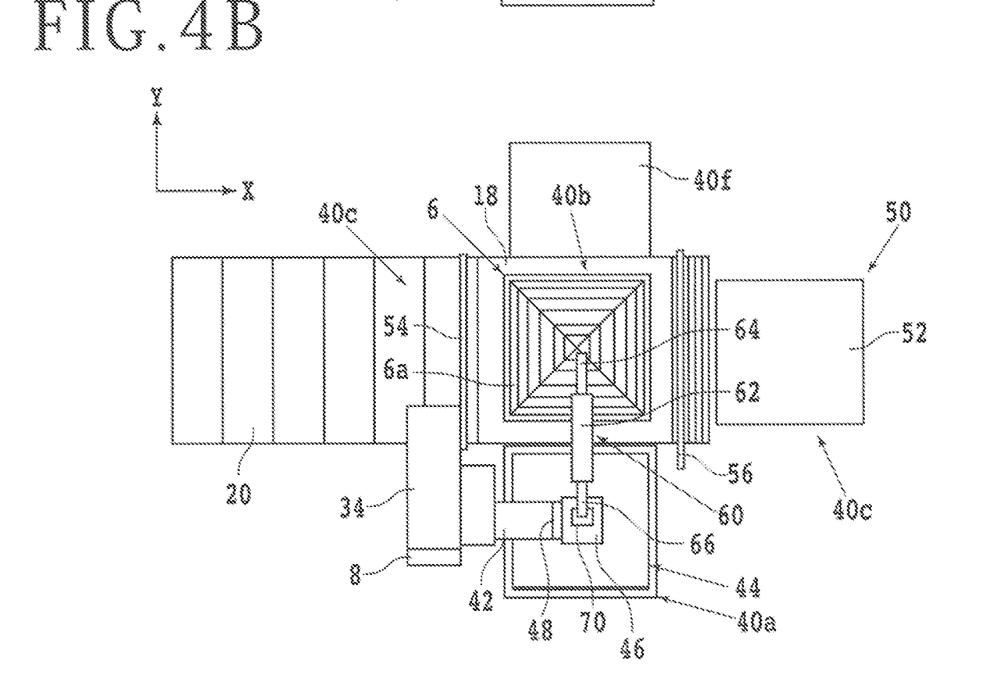
FIG. 4B is a plan view schematically illustrating a manner in which the delivery pad holds under suction the workpiece placed in a placing area.

Next, the moving unit is actuated and moved in one of the indexing-feed directions, i.e., the Y-axis directions, to move the delivery pad 44 into the placing area 40a. The delivery pad 44 is then lowered to cause the suction surface to contact the workpiece 1. Thereafter, a negative pressure is applied from the delivery pad 44 to the workpiece 1, which is attracted under suction to the delivery pad 44. FIG. 4B schematically illustrates in plan a manner in which the delivery pad 44 holds under suction the workpiece 1 placed in the placing area 40a. Thereafter, the delivery pad 44 is elevated and is moved in one of the indexing-feed directions, i.e., the Y-axis directions and positioned above the loading/unloading area 40b. Then, the processing-feed unit is actuated to move the chuck table 6 into the loading/unloading area 40b, and the delivery pad 44 is lowered.

Figure 2B:
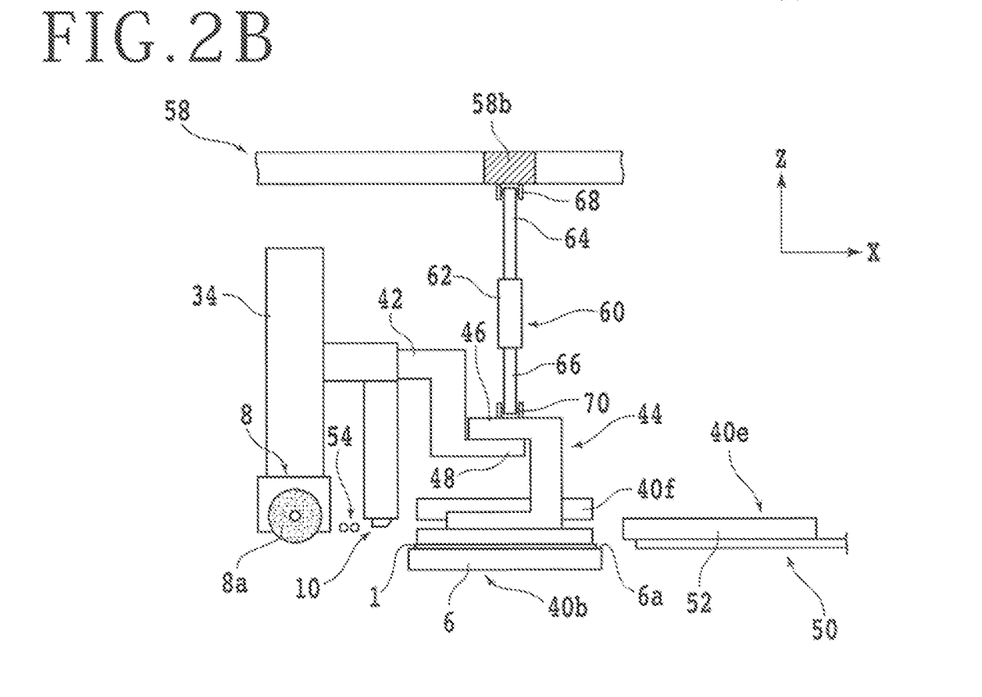
FIG. 2B is a side elevational view schematically illustrating a manner in which the workpiece is loaded onto a chuck table by the delivery pad.

FIG. 2B schematically illustrates in side elevation a manner in which the workpiece 1 is loaded onto the chuck table 6 by the delivery pad 44. When the workpiece 1 contacts the holding surface 6a of the chuck table 6, the delivery pad 44 stops being lowered. The delivery pad 44 releases the workpiece 1 from the attracted state under suction, and the chuck table 6 holds the workpiece 1 under suction, whereupon the loading of the workpiece 1 by the delivery pad 44 is completed. Since the workpiece 1 can be delivered by moving the delivery pad 44 with the moving unit, the cutting apparatus 2 according to the present embodiment does not require an independent moving mechanism for moving the workpiece 1.

Figure 3A:
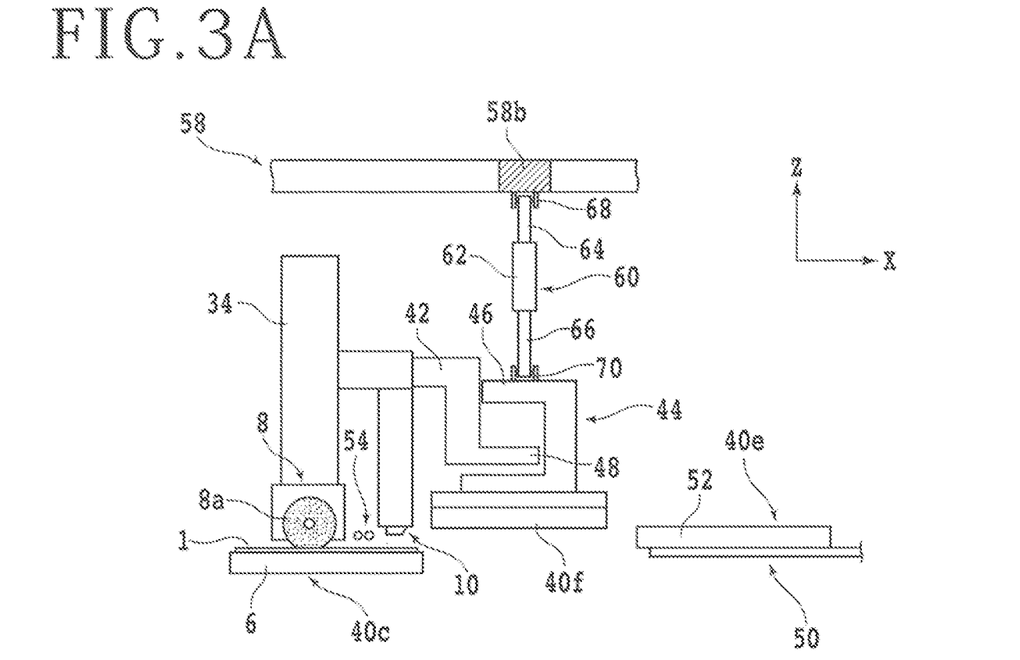
FIG. 3A is a side elevational view schematically illustrating a manner in which the workpiece is cut by a cutting unit.

FIG. 3A schematically illustrates in side elevation a manner in which the workpiece 1 is cut by the cutting unit 8. If the delivery pad 44 remains mounted on the moving unit, it increases the load on the moving unit that processing-feeds and indexing-feeds the cutting unit 8. Therefore, before the workpiece 1 is cut, the delivery pad 44 is released from the moving unit and stored in the standby area 40f. FIG. 3A illustrates the delivery pad 44 that is placed in the standby area 40f. For placing the delivery pad 44 in the standby area 40f, the moving unit is actuated to bring the delivery pad 44 into contact with the standby area 40f and releases the delivery pad 44 from the held state under suction.

For cutting the workpiece 1, the X-axis movable table 18 is moved to the processing area 40c. Then, while the cutting blade 8a of the cutting unit 8 is being rotated, the cutting blade 8a is positioned at a predetermined height suitable for cutting the workpiece 1. Thereafter, the X-axis movable table 18 is moved in one of the processing-feed directions, i.e., the X-axis directions, causing the cutting blade 8a to cut the workpiece 1 held on the holding surface 6a of the chuck table 6. Prior to cutting the workpiece 1, the camera unit 10 captures an image of the workpiece 1, the position where the workpiece 1 is to be cut is confirmed from the captured image, and an alignment step is carried out for aligning the workpiece 1 and the cutting unit 8 with each other. After the workpiece 1 has been cut by the cutting blade 8a along one of the projected dicing lines on the workpiece 1, the cutting unit 8 is moved in one of the indexing-feed directions, i.e., the Y-axis directions, and the chuck table 6 is processing-fed again to cause the cutting blade 8a to cut the workpiece 1 along a next one of the projected dicing lines. After the cutting of the workpiece 1 along one direction has been completed, the chuck table 6 is rotated about the axis perpendicular to the holding surface 6a, and then the workpiece 1 is cut along another direction. While the workpiece 1 is being cut, the nozzle 8b ejects the cutting fluid that is supplied to the cutting blade 8a and the workpiece 1. Pieces of swarf produced from the workpiece 1 during the cutting process are washed away by the cutting fluid. Heat generated from the friction between the workpiece 1 and the cutting blade 8a is removed by the cutting fluid.

The operator of the cutting apparatus 2 may place a new uncut workpiece 1 in the placing area 40a while the workpiece 1 is being cut by the cutting blade 8a. In other words, the operator can load a new uncut workpiece 1 anytime into the cutting apparatus 2. When the cutting of the workpiece 1 is completed, the chuck table 6 is moved to the loading/unloading area 40b. At this time, the cleaning nozzle 54 ejects the cleaning fluid to the workpiece 1 to clean the processed surface of the workpiece 1.

Figure 3B:
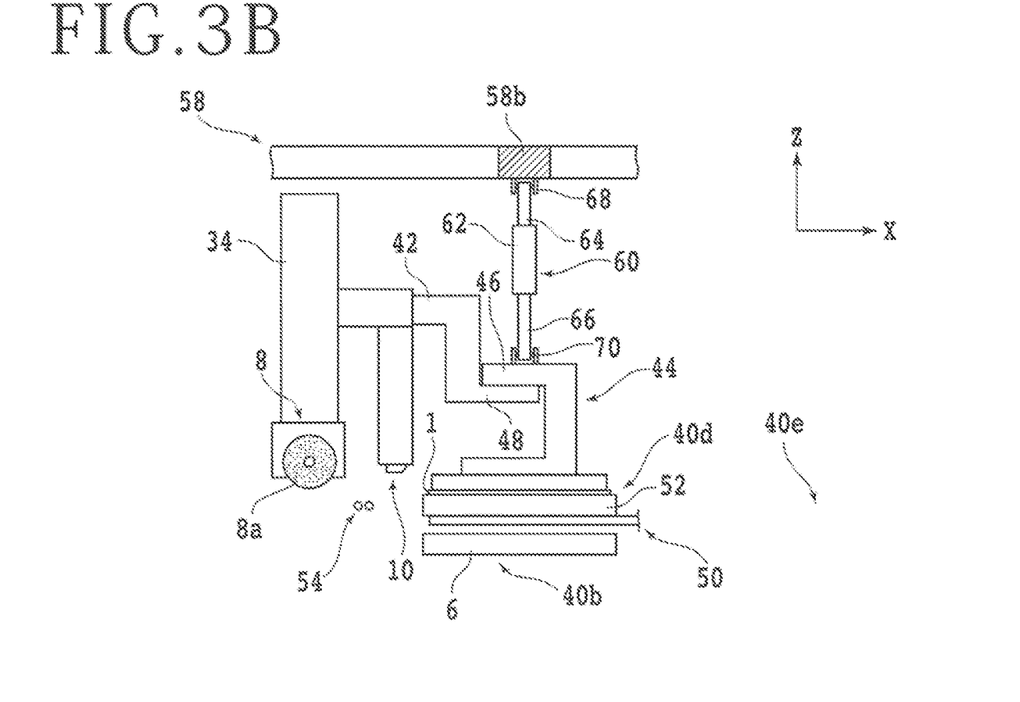
FIG. 3B is a side elevational view schematically illustrating a manner in which the workpiece is placed onto an unloading unit by the delivery pad.

Next, the cut workpiece 1 is unloaded from the chuck table 6. For unloading the workpiece 1 from the chuck table 6, the delivery pad 44 is mounted again on the arm 42 of the Z-axis movable plate 34 of the moving unit. First, the moving unit is actuated to move the delivery pad 44, and the delivery pad 44 holds the workpiece 1 under suction. Then, the workpiece 1 is elevated by being moved in one of the directions, i.e., the Z-axis directions, perpendicular to the holding surface 6a. Thereafter, the unloading table 52 of the unloading unit 50 is moved in one of the processing-feed directions, i.e., the X-axis directions, and positioned in the area 40d directly above the loading/unloading area 40b. Then, the delivery pad 44 is lowered to bring the workpiece 1 into contact with the unloading table 52 and releases the workpiece 1 from the attracted state under suction. The workpiece 1 is now placed on the unloading table 52. FIG. 3B schematically illustrates in side elevation a manner in which the workpiece 1 is placed onto the unloading table 52 by the delivery pad 44. Thereafter, the unloading table 52 of the unloading unit 50 is moved to the unloading area 40e where the workpiece 1 is unloaded from the cutting apparatus 2.

The workpiece 1 that is to be unloaded from the cutting apparatus 2 carries fluids such as the cutting fluid and the cleaning fluid. The fluids tend to be scattered around in a container that houses the workpiece 1 and may cause contamination. If the fluids remain attached to the workpiece 1, they may be responsible for deteriorating the workpiece 1. To prevent such contamination and deterioration, when the unloading table 52 is moved to the unloading area 40e, the drying nozzle 56 ejects a gas under high pressure to the workpiece 1, drying the workpiece 1 and removing the fluids from the workpiece 1.

Before the workpiece 1 is unloaded from the unloading table 52, the cutting apparatus 2 can start delivering a new uncut workpiece 1 with the delivery pad 44. In other words, the operator of the cutting apparatus 2 can unload the workpiece 1 that has been cut by the cutting unit 8 from the unloading table 52 with any desired timing.

In the cutting apparatus 2, the delivery pad 44 detachably mounted on the moving unit can deliver the workpiece 1. Since the delivery pad 44 can be moved by the moving unit that moves the cutting unit 8, etc., the cutting apparatus 2 can deliver the workpiece 1 without using an independent delivery mechanism. In other words, the cutting apparatus 2 does not require an independent moving mechanism for delivering the workpiece 1, and is hence not complex in configuration and is prevented from being large in size and high in cost. As the delivery pad 44 includes a holding mechanism for holding the workpiece 1, the delivery pad 44 has a non-negligible weight. The cutting unit 8 needs to be moved accurately in order to cut the workpiece 1 highly accurately. However, since the moving unit moves the delivery pad 44 in addition to the cutting unit 8 and the camera unit 10, the load on the moving unit is larger than heretofore. Therefore, the moving unit tends to wear early.

When wear on the moving unit has progressed excessively, the accuracy of operation of the moving unit is lowered. If the moving unit fails to indexing-feed the cutting unit 8 highly accurately, for example, then the cutting blade 8a may possibly cut into devices formed on the workpiece 1. Further, if the moving unit is unable to position the cutting unit 8 at a suitable height, then the cutting blade 8a cannot form cut grooves to a projected depth in the workpiece 1. Specifically, when the cutting blade 8a cuts the workpiece 1 in order to divide the workpiece 1 into device chips, if the lowermost end of the cutting blade 8a does not reach a position below the bottom surface of the workpiece 1, then the workpiece 1 cannot be divided appropriately. In view of these shortcomings, the cutting apparatus 2 according to the present embodiment includes a counterbalance assembly 60 for reducing the load imposed on the moving unit by the weight of the delivery pad 44. The counterbalance assembly 60 is connected to the delivery pad 44 for applying a pull-up force to the delivery pad 44. The pull-up force has a component directed along the directions perpendicular to the holding surface 6a of the chuck table 6, i.e., the Z-axis directions, in order to resist the weight of the delivery pad 44.

Figure 6A:
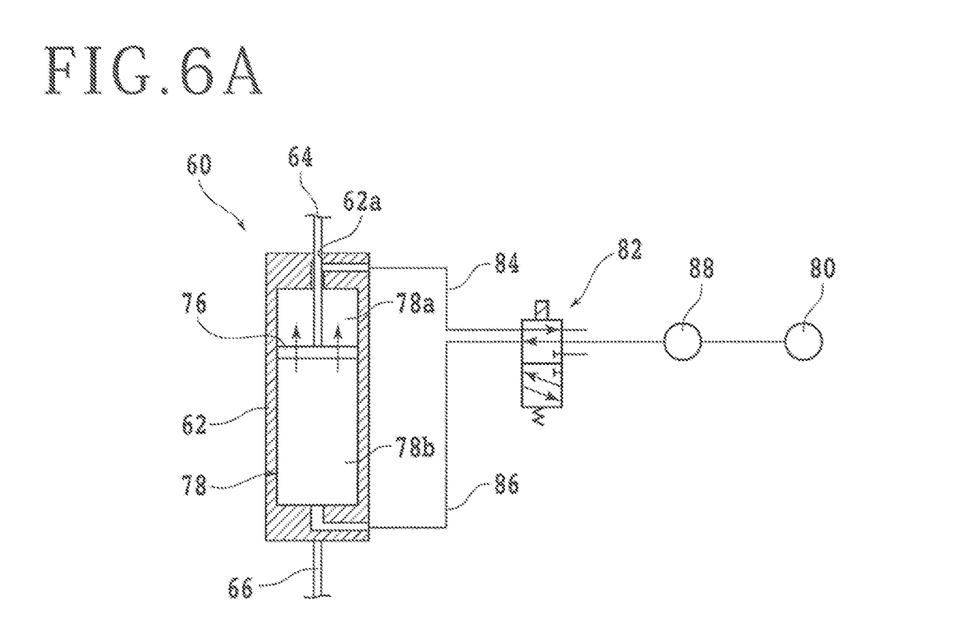
FIG. 6A is a cross-sectional view schematically illustrating a fluid pressure cylinder that is actuated to extend the counterbalance assembly.
Figure 6B:
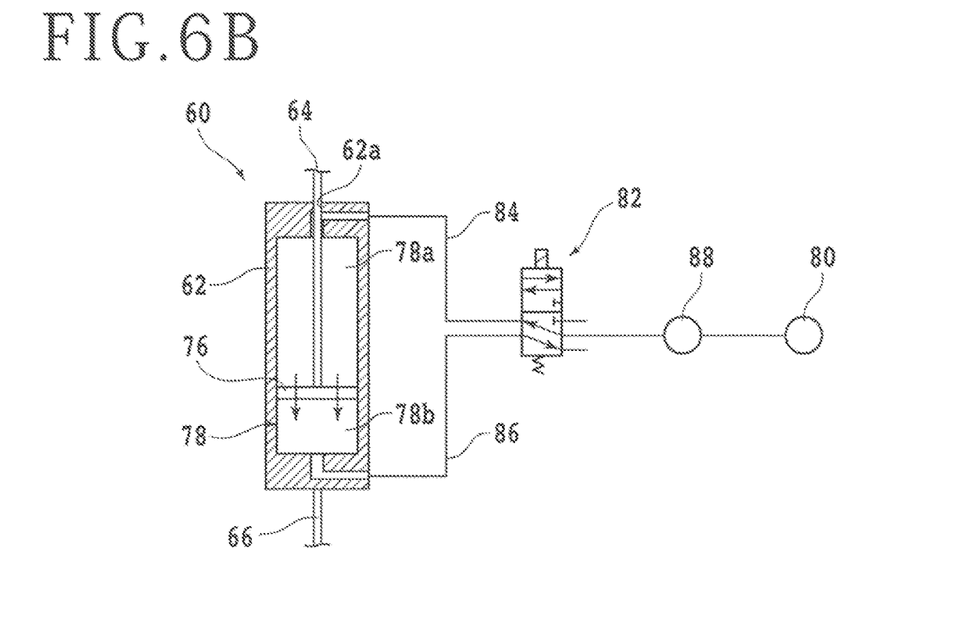
FIG. 6B is a cross-sectional view schematically illustrating the fluid pressure cylinder that is actuated to contract the counterbalance assembly.

As illustrated in FIG. 1, a support frame 58 that supports the counterbalance assembly 60 is mounted on the upper surface of the apparatus base 4 of the cutting apparatus 2. The support frame 58 includes a plurality of vertical support posts 58a erected on the upper surface of the apparatus base 4 and a plurality of horizontal support beams 58b interconnecting the upper ends of the support posts 58a. One of the support beams 58b extends over the loading/unloading area 40b. The counterbalance assembly 60 is connected to and supported by the support beam 58b over the loading/unloading area 40b. The counterbalance assembly 60 includes a fluid pressure cylinder 62 such as an air cylinder, for example. FIGS. 6A and 6B schematically illustrate in cross section the fluid pressure cylinder 62 of the counterbalance assembly 60. The fluid pressure cylinder 62 has a housing port 62a defined in an upper end portion thereof. The support beam 58b and the fluid pressure cylinder 62 are interconnected by a piston rod 64 having a lower end portion slidably housed in the housing port 62a. The fluid pressure cylinder 62 has a lower end to which there is fixed an upper end of a rod 66 that interconnects an upper portion of the delivery pad 44 and the fluid pressure cylinder 62.

As illustrated in FIGS. 1, 2A through 3B, and 5A, the piston rod 64 has an upper end pivotally connected by a pivot joint 68 to the support beam 58b. The pivot joint 68 pivotally connects the piston rod 64 to the support beam 58b such that the piston rod 64 is swingable along the Y-axis directions. Specifically, the pivot joint 68 includes a shaft 72 (see FIG. 5A) by which the upper end of the piston rod 64 is pivotally connected to the support beam 58b. The piston rod 64 is swingable about the shaft 72. Similarly, the rod 66 has a lower end pivotally connected by a pivot joint 70 to the delivery pad 44. The pivot joint 70 pivotally connects the rod 66 to the delivery pad 44 such that the rod 66 is swingable along the Y-axis directions. The pivot joint 70 includes a shaft 74 (see FIG. 5A) by which the lower end of the rod 66 is pivotally connected to the delivery pad 44. The rod 66 is swingable about the shaft 74.

As illustrated in FIGS. 6A and 6B, the fluid pressure cylinder 62 has a piston 76 connected to the lower end of the piston rod 64 and slidably housed in an inner bore 78 defined in the fluid pressure cylinder 62.

The inner bore 78 is divided by the piston 76 into an upper compartment 78a and a lower compartment 78b. The piston 76 is movable vertically in the inner bore 78 in the fluid pressure cylinder 62. The piston 76 is moved in the inner bore 78 when air is supplied to or discharged from one of or both the upper compartment 78a and the lower compartment 78b. The upper compartment 78a and the lower compartment 78b are connected to an air supply source 80 such as an air pump through pipes 84 and 86, a solenoid valve 82, and a pressure regulator 88. The counterbalance assembly 60 can selectively be extended and contracted by the fluid pressure cylinder 62.

When the solenoid valve 82 is actuated to connect the air supply source 80 to the lower compartment 78b of the fluid pressure cylinder 62, as illustrated in FIG. 6A, for example, the air pressure builds up in the lower compartment 78b, lifting the piston 76 to shorten the length of the piston rod 64 that is housed in the fluid pressure cylinder 62. In other words, the length of the counterbalance assembly 60 increases. On the other hand, when the solenoid valve 82 is actuated to connect the air supply source 80 to the upper compartment 78a of the fluid pressure cylinder 62, as illustrated in FIG. 6B, the air pressure builds up in the upper compartment 78a, lowering the piston 76 to increase the length of the piston rod 64 that is housed in the fluid pressure cylinder 62. In other words, the length of the counterbalance assembly 60 decreases.

When the delivery pad 44 is mounted on the moving unit and moved thereby, the distance between the pivot joint 68 and the pivot joint 70 varies. Providing the solenoid valve 82 is controlled to extend and contract the counterbalance assembly 60 so as to equalize the length of the counterbalance assembly 60 to the distance between the pivot joint 68 and the pivot joint 70, the movement of the delivery pad 44 is not obstructed by the moving unit. The solenoid valve 82 is controlled by a control unit, not illustrated, of the cutting apparatus 2. The control unit of the cutting apparatus 2 controls the components of the cutting apparatus 2 under predetermined conditions. The control unit is configured as a computer that includes, for example, a processing unit such as a processor, typically a central processing unit (CPU), a main storage unit such as a dynamic random access memory (DRAM), and an auxiliary storage unit such as a flash memory. The control unit has its functions realized by operating the processing unit, etc. according to software stored in the auxiliary storage unit. The control unit controls the moving unit to move the delivery pad 44 and also controls the solenoid valve 82 on the basis of predicted changes in the distance between the pivot joint 68 and the pivot joint 70 to change the length of the counterbalance assembly 60.

Figure 5A:
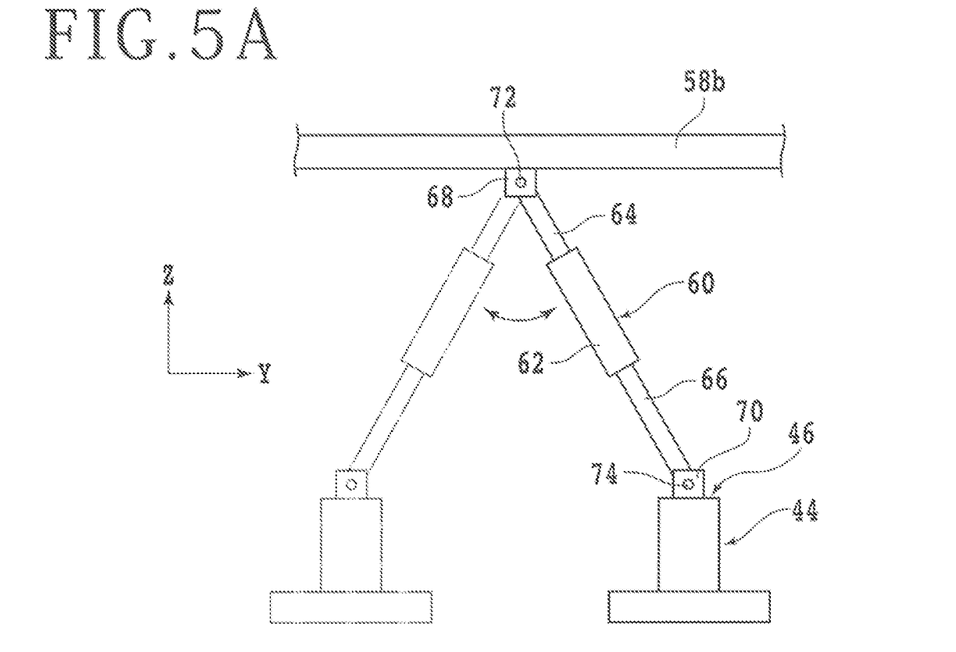
FIG. 5A is a side elevational view schematically illustrating the delivery pad and a counterbalance assembly.

FIG. 5A schematically illustrates in side elevation the delivery pad 44 moved by the moving unit in a plane defined by the Y-axis directions and the Z-axis directions, and the counterbalance assembly 60 that varies in length and shape according to the movement of the delivery pad 44. FIGS. 2A, 2B, 3A, and 3B illustrate a manner in which the counterbalance assembly 60 varies in shape according to the movement of the delivery pad 44 and also schematically illustrate a manner in which the counterbalance assembly 60 keeps the support beam 58b and the upper portion of the delivery pad 44 connected to each other at all times. The counterbalance assembly 60 applies the pull-up force having the component directed along the upward Z-axis direction to the delivery pad 44, reducing the force that is applied to the moving unit due to the weight of the delivery pad 44. The magnitude of the pull-up force that is applied to the delivery pad 44 by the counterbalance assembly 60 is controlled by the pressure of the air supplied to the inner bore 78 of the fluid pressure cylinder 62. The pressure of the air supplied to the inner bore 78 is controlled by the pressure regulator 88, for example.

For example, the magnitude of the pull-up force applied to the delivery pad 44 by the counterbalance assembly 60 is preferably the magnitude of the gravitational force applied to the delivery pad 44 or less. If the magnitude of the pull-up force applied to the delivery pad 44 by the counterbalance assembly 60 exceeds the magnitude of the gravitational force applied to the delivery pad 44, then the delivery pad 44 is lifted off the moving unit, and the moving unit is unable to move the delivery pad 44 to a nicety. On the other hand, if the magnitude of the pull-up force applied to the delivery pad 44 by the counterbalance assembly 60 is extremely small compared with the magnitude of the gravitational force applied to the delivery pad 44, then the counterbalance assembly 60 cannot sufficiently reduce the load on the moving unit. The magnitude of the pull-up force applied to the delivery pad 44 by the counterbalance assembly 60 should be in the range of 50 to 70 percent of the gravitational force applied to the delivery pad 44. Stated otherwise, the control unit should control the solenoid valve 82 and the pressure regulator 88 at all times in order to keep the magnitude of the pull-up force applied to the delivery pad 44 by the counterbalance assembly 60 within a predetermined range while the delivery pad 44 is being mounted on the moving unit.

In order to manage the magnitude of the pull-up force applied to the delivery pad 44, the inner bore 78 of the fluid pressure cylinder 62, the pipes 84 and 86, etc. may be combined with pressure meters, not illustrated. In this case, the control unit controls the solenoid valve 82 and the pressure regulator 88 by referring to pressure values measured by the pressure meters in the inner bore 78 of the fluid pressure cylinder 62, the pipes 84 and 86, etc. Alternatively, the pressure regulator 88 may be combined with a relief mechanism. In this case, the fluid pressure cylinder 62 may extend and contract following the movement of the delivery pad 44, and the pressure in the inner bore 78 of the cylinder 62 may be kept at a predetermined preset value. For example, in a case where the pressure in the inner bore 78 is higher than the preset value, the relief mechanism of the pressure regulator 88 discharges air from the inner bore 78 until the pressure in the inner bore 78 reaches the preset value. In a case where the pressure in the inner bore 78 is lower than the preset value, the inner bore 78 is supplied with air from the air supply source 80 until the pressure in the inner bore 78 reaches the preset value.

The delivery pad 44 remains continuously connected to the counterbalance assembly 60 when the delivery pad 44 is dislodged from the moving unit and stored in the standby area 40f. In order to prevent the delivery pad 44 stored in the standby area 40f from moving unexpectedly and falling off the standby area 40f, the counterbalance assembly 60 may apply a force oriented in the downward Z-axis direction to the delivery pad 44. The delivery pad 44 may fall off the standby area 40f due to vibrations that occur when the X-axis movable table 18 and the unloading table 52 move and the moving unit is actuated, for example.

The control unit controls the solenoid valve 82 to cause the fluid pressure cylinder 62 to produce a force in a direction to extend the counterbalance assembly 60, as illustrated in FIG. 6A, immediately before the engaged portion 46 and the engaging portion 48 are separated from each other. In this case, the delivery pad 44 is pressed against the table-shaped standby area 40f, applying a force equal to or larger than the gravitational force on the delivery pad 44 to the upper surface of the standby area 40f. Consequently, the frictional force produced between the standby area 40f and the lower surface of the delivery pad 44 increases, making the delivery pad 44 less liable to move. On the other hand, the control unit controls the solenoid valve 82 to cause the fluid pressure cylinder 62 to produce a force in a direction to contract the counterbalance assembly 60, as illustrated in FIG. 6B, immediately after the engaged portion 46 and the engaging portion 48 are connected to each other. In this case, the counterbalance assembly 60 is now able to perform its function.

As illustrated in FIGS. 2A and 2B, the pivot joint 68 that connects the counterbalance assembly 60 to the support beam 58b and the pivot joint 70 that connects the counterbalance assembly 60 to the upper portion of the delivery pad 44 act to restrain the delivery pad 44 from moving in the X-axis directions. Specifically, in the cutting apparatus 2 according to the present embodiment, the delivery pad 44 is restrained from moving in unpredicted directions even if the counterbalance assembly 60 does not apply a force tending to press the delivery pad 44 against the standby area 40f. Further, the standby area 40f may have a positioning pin on a rest surface thereof for placing the delivery pad 44 thereon, the positioning pin being fittable in a hole defined in the delivery pad 44. In this case, the delivery pad 44 placed in the standby area 40f is more reliably restrained from moving in unpredicted directions by the positioning pin.

In the cutting apparatus 2 described above, the counterbalance assembly 60 remains continuously connected to the delivery pad 44 as it moves without obstructing the movement of the delivery pad 44. Inasmuch as part of the weight of the delivery pad 44 is borne through the counterbalance assembly 60, the load imposed on the moving unit due to the weight of the delivery pad 44 is reduced. Therefore, wear on the moving unit is restrained.

Figure 5B:
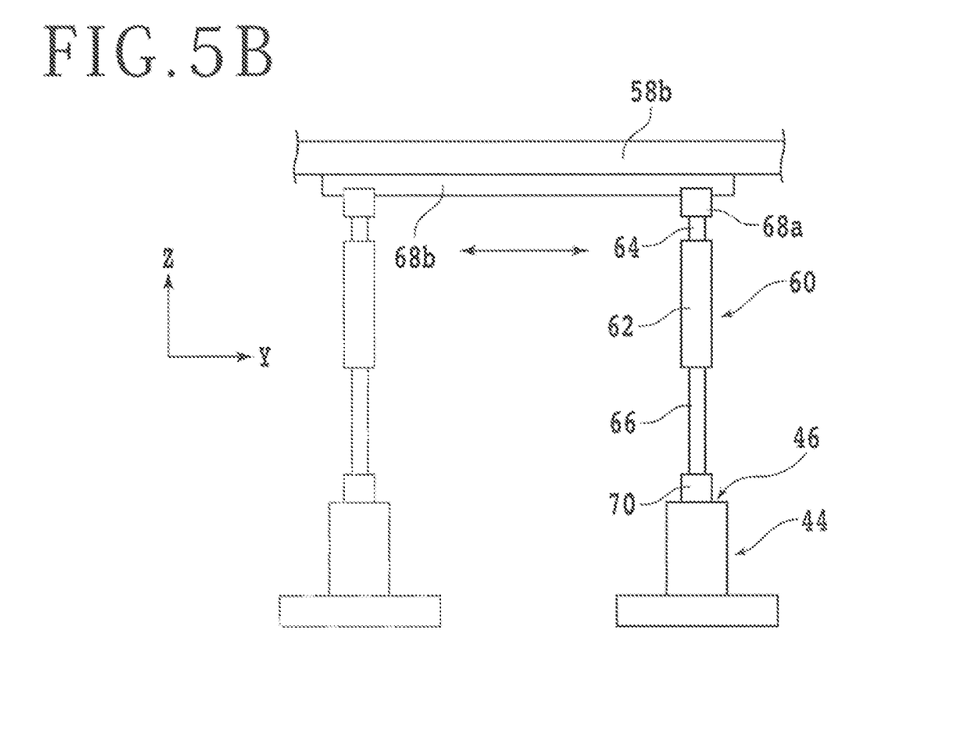
FIG. 5B is a side elevational view schematically illustrating a modified support structure for the counterbalance assembly.

The present invention is not limited to the embodiment described above, but various changes and modifications may be made therein without departing from the scope of the invention. According to the above embodiment, the upper end of the counterbalance assembly 60 is connected by the pivot joint 68 to the support beam 58b of the support frame 58 mounted on the upper surface of the apparatus base 4. However, the present invention is not limited to such a detail. The upper end of the counterbalance assembly 60 that supports the delivery pad 44 may be connected to the support beam 58b by another structure. FIG. 5B schematically illustrates in side elevation a modified support structure for the counterbalance assembly 60. The modified support structure for the counterbalance assembly 60 as illustrated in FIG. 5B includes a rail 68b fixed to a lower surface of the support beam 58b and extending in the Y-axis directions and a movable member 68a slidably mounted on the rail 68b.

The upper end of the piston rod 64 of the counterbalance assembly 60 is fixed to the movable member 68a.

When the delivery pad 44 is moved along the Y-axis directions by the moving unit, the counterbalance assembly 60 and the movable member 68a are also moved along the Y-axis directions. Therefore, the movement of the delivery pad 44 is not obstructed by the counterbalance assembly 60. In this case, further, the counterbalance assembly 60 applies a force that has only a component directed in the upward Z-axis direction to the delivery pad 44, supporting the delivery pad 44. Therefore, the control unit that controls the solenoid valve 82 for selectively supplying air and stopping supplying air to the fluid pressure cylinder 62 can control the solenoid valve 82 such that the counterbalance assembly 60 supports the delivery pad 44 with a constant force. Consequently, the operation of controlling the solenoid valve 82 with the control unit is simplified, the delivery pad 44 is supported more stably, and the load on the moving unit undergoes less variations.

In the cutting apparatus 2 according to the present invention, the structure that supports the counterbalance assembly 60 is not limited to the support frame 58. The counterbalance assembly 60 may be supported by an apparatus housing, not illustrated, that covers the apparatus base 4. In this case, the support frame 58 dedicated to supporting the counterbalance assembly 60 does not need to be mounted on the apparatus base 4.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A cutting apparatus for cutting a workpiece with a cutting blade, comprising:

a chuck table having an upwardly exposed holding surface, for holding the workpiece on the holding surface;

a cutting unit for cutting the workpiece held on the holding surface of the chuck table with the cutting blade that is mounted on a spindle;

a processing-feed unit for moving the chuck table in a processing-feed direction parallel to the holding surface between a processing area in which the workpiece is cut by the cutting blade and a loading/unloading area in which the workpiece is loaded and unloaded;

a moving unit for moving the cutting unit in an indexing-feed direction parallel to the holding surface and perpendicular to the processing-feed direction and a direction perpendicular to the holding surface;

a placing area disposed adjacent to the loading/unloading area, for placing the workpiece to be cut therein;

an unloading table for supporting the workpiece that has been cut, the unloading table being movable between an area directly above the loading/unloading area and an unloading area disposed adjacent to the loading/unloading area;

a delivery pad for delivering the workpiece to be cut that is placed in the placing area onto the chuck table that is positioned in the loading/unloading area and delivering the workpiece that has been cut that is placed on the chuck table to onto the unloading table; and a counterbalance assembly connected to the delivery pad, for applying a pull-up force to the delivery pad, wherein the delivery pad is detachably mounted on the moving unit in a standby area disposed adjacent to the loading/unloading area, holds the workpiece under suction while being mounted on the moving unit, and delivers the workpiece by being moved by the moving unit while holding the workpiece under suction.

2. The cutting apparatus according to claim 1, wherein a magnitude of the pull-up force applied to the delivery pad by the counterbalance assembly is equal to or smaller than a magnitude of a gravitational force imposed on the delivery pad.

3. The cutting apparatus according to claim 2, wherein the counterbalance assembly includes
   a fluid pressure cylinder having an end fixed to an upper portion of the delivery pad and housing part of a piston rod therein over a variable length, and
   the fluid pressure cylinder is extensible and contractible by varying the variable length over which the part of the piston rod is housed in the fluid pressure cylinder.

4. The cutting apparatus according to claim 1, wherein the counterbalance assembly includes
   a fluid pressure cylinder having an end fixed to an upper portion of the delivery pad and housing part of a piston rod therein over a variable length, and
   the fluid pressure cylinder is extensible and contractible by varying the variable length over which the part of the piston rod is housed in the fluid pressure cylinder.

* * * * *